United States Patent [19]

Osaka

[11] 4,442,444
[45] Apr. 10, 1984

[54] AVALANCHE PHOTODIODES

[75] Inventor: Fukunobu Osaka, Yokohama, Japan

[73] Assignee: Fujitsu Limited, Kawasaki, Japan

[21] Appl. No.: 281,304

[22] Filed: Jul. 8, 1981

[30] Foreign Application Priority Data

Jul. 8, 1980 [JP] Japan .................................. 55-93025
Aug. 28, 1980 [JP] Japan ................................ 55-118592

[51] Int. Cl.³ ........................................... H01L 29/90
[52] U.S. Cl. ........................................ 357/13; 357/30; 357/52; 357/16
[58] Field of Search ...................... 357/30, 13, 16, 52

[56] References Cited

U.S. PATENT DOCUMENTS

| | | | |
|---|---|---|---|
| 4,153,904 | 5/1979 | Tash, Jr. ................................. | 357/13 |
| 4,258,375 | 3/1981 | Hsieh ................................. | 357/13 X |
| 4,323,909 | 4/1982 | Valdmann ............................ | 357/13 |
| 4,326,211 | 4/1982 | Smeets ................................ | 357/13 X |
| 4,383,266 | 5/1983 | Sakai et al. ............................ | 357/16 |

OTHER PUBLICATIONS

Matsushima, Jpn. J. Appl., vol. 19, Jul. 1980, No. 7.

*Primary Examiner*—Martin H. Edlow
*Attorney, Agent, or Firm*—Staas & Halsey

[57] ABSTRACT

An avalanche photodiode sensitive to wavelengths ranging from 1.2 to 1.65 micrometers and comprising a light absorbing layer and first and second window layers of a semiconductor having a band gap larger than the semiconductor of the light-absorbing layer respectively grown on a substrate, is disclosed. All the layers are doped with the same conductivity type impurity but the doping concentration is higher for the second window layer than for the first window layer. A p-n junction for avalanche multiplication is formed in the second window layer and another deep p-n junction providing a guard ring effect is formed surrounding the avalanche p-n junction to reach the first window layer but remaining a specific distance above the heterojunction between the first window layer and the light absorbing layer. Under a reverse bias, a much deeper depletion region extends in the region comprising the guard ring p-n junction than in the region comprising the avalanche p-n junction, thereby breakdown is limited exclusively to and uniformly occurs in the region comprising the avalanche p-n junction, resulting in higher avalanche-gains, sensitivity and response and with lower values of dark-current an noise. In addition, an improved method for producing the avalanche photodiode is disclosed.

15 Claims, 13 Drawing Figures

AVALANCHE PHOTODIODES

BACKGROUUND OF THE INVENTION

This invention relates to an improvement in an avalanche photodiode (Hereinafter referred to as an APD.). More specifically, the invention relates to an improved guard ring configuration having a more reliable grade of performance yielding breakdown exclusively in the central region of a pn junction formed in a window layer, or a multiplication layer, through which a light passes to reach the light absorbing layer (Hereinafter referred to as the guard ring effect.). The improvement also results in a lower tunnel current originating in and flowing throught the light absorbing layer, and is applicable to an APD sensitive to light having a wavelength in the range of, 1.2 through 1.65 micrometers, and comprising a combination of a light absorbing layer including a semiconductor having a relatively small band gap Eg, and a window layer including a semiconductor having a relatively large band gap Eg. The typical combination is InGaAsP or InGaAs and InP or GaSb and GaAsSb.

An APD has a reverse biased p-n junction which causes the avalanche multiplication of a current of electrons or holes generated by photoelectric effect in a light absorbing region which is exposed to the light which has arrived at the light absorbing region after passing through the window layer. The most essential function of the p-n junction is that it allows breakdown to occur exclusively in the central region of a pn junction formed in the window layer. Therefore, typical APD's available in the prior art are povided with a guard ring configuration in which an abrupt p-n junction is formed in the light sensitive area and this area containing the abrupt p-n junction is surrounded by a graded p-n junction ring, therey breakdown exclusively occurs in the light sensitive region. In addition, the p-n junction is required to have uniform performance over the junction to realize a higher avalanche-gain, sensitivity and response, and to realize lower dark-current and noise.

It is not necessarily difficult to form a guard ring having a graded p-n junction in Si or Ge based APD's. Further, due to the rather short fundamental absorption edge of Si and also due to the generally unsatisfactory performance of Ge based APD's, APD's usually have two independent layers. The first is a light absorbing layer comprising a semiconductor having a relatively small band gap Eg and the other is a window layer formed of a semiconductor having a relatively large band gap Eg. It is clear that the semiconductor forming the light absorbing layer determines the sensitive wavelength range and the window layer determines the characteristics of the avalanche multiplication. As mentioned earlier, the typical combination of the materials for the light absorbing layer and for the window layer is a pair of InGaAsP or InGaAs and InP layers or a pair of GaSb and GaAsB layers, albeit these combinations are merely examples.

It is particularly noted, however, that it is extremely difficult to form a graded p-n junction in an InP or GaAsSb layer. For this reason, many attempts have been made to develop InGaAsP or InGaAs based APD's and/or GaSb based APD's without requiring any conventional type actual guard ring. The efforts of Nishida et al, Applied Physics Letters 35 (3) Aug. 1, 1979, pages 251–253, are included in this category.

The APD's invented by Nishida et al. have a p-n junction located slightly above the heterojuntion, which is positioned between the light absorbing InGaAsP or InGaAs layer and the windown InP layer. Since the distance between the p-n junction and the heterojunction is quite short, the intensity of the electric field in the light absorbing layer becomes non-uniform in the horizontal direction. In other words, the intensity of the electric field becomes larger in the central region of the p-n junction than in the other regions of the junction. This means the intensity of the electric field in the light sensitive layer is larger than in the other regions. Further, since the breakdown voltage lowers as the band gap of the semiconductor becomes smaller, the breakdown voltage of the light absorbing layer just beneath the central region of the pn junction is the lowest with the respect to the neighboring regions, including the other regions of the light absorbing layer and the window layer. Thus, the guard ring effect is realized.

The inventors of the present invention have discovered that the APD's invented by Nishida et al. have the following drawbacks. First, it is not easy to form a p-n junction slightly above the InGaAsP or InGaAs/InP heterojunction. Second, since the intensity of the electric field is necessarily high in the InGaAsP or InGaAs light absorbing layer facing the light window, tunnel current inevitably occurs in this region. This results in increased dark-current, and in a low avalanche-gain. It is wellknown that the magnitude of tunnel current is larger for semiconductors having a smaller band gap Eg, and that the fundamental absorption edge $\lambda$ is determined by an inequality $\lambda \leq hc/Eg$. In view of the fact that the signal transmission loss in an optical fiber is less for longer wavelength light and that optoelectronic elements sensitive to longer wavelength lights are increasingly preferable, the above mentioned drawback due to the large amount of tunnel current which is inherent to the semiconductors having a smaller band gap Eg and a longer fundamental absorbtion edge, such as InGaAsP, InGaAs and GaSb, is fairly significant. Katsuhiko Nishida et al. reports that distinct improvements in avalanche-gain and dark-current characteristics have been successfully realized by controlling the p-n junction position in a window InP layer of an APD having an InGaAsP/InP heterostructure but having no actual guard ring. The report refers to the effects of p-n junction depth on photocurrent and dark-current characteristics, and emphasizes the possibility of making the distance between the p-n junction and the heterojunction extremely small, for example 0.5 micrometers. This structure results from selective diffusion of Cd from a $Cd_3P_2$ source, and produces the guard ring effect without using an actual guard ring. Further, the avalanche-gain and dark-current for an APD comprising a light absorbing InGaAsP or InGaAs layer and a window InP layer are reported to be improved. The report particularly points out that such improvements are realized without using an actual guard ring.

SUMMARY OF THE INVENTION

An object of this invention is to provide an APD sensitive to the wavelength range of 1.2 micrometers through 1.65 micrometers, and which is provided with a semiconductor light absorbing layer and a semiconductor window layer having a larger band gap than that of the light absorbing layer. The APD further comprises a guard ring configuration which readily realizes the efficient guard ring effect without the above presented tunnel current problem, resultantly realizing higher of avalanche-gains, sensitivity and response and with lower dark-current and noise.

Another object this invention is to provide a method for production of the APD presented above, comprising a simplified impurity diffusion step. Specifically, to provide a stepped diffusion in one step with a reduced diffusion temperature and in a reduced diffusion time, resultantly removing the possibility of producing crystal defects in either the active or sensitive layers, in addition to the advantage of a reduced number of steps and the reduced processing time.

To accomplish the first object, an APD in accordance with this invention is provided with (a) one n- or p-doped semiconductor substrate of, for example, InP or GaSb having a first electrode on one surface thereof, (b) one semiconductor light absorbing layer, for example, InGaAsP or InGaAs in the case of the InP substrate or GaSb in the case of the GaSb substrate doped with the same conductivity type impurity as that of the substrate in a relatively low concentration, the light absorbing layer being grown on the substrate or preferably on a buffer layer interposed between the substrate and the light absorbing layer, (c) one first window semiconductor layer having a larger band gap Eg than that of the semiconductor light absorbing layer, for example, InP in the case of InGaAsP or InGaAs light absorbing layer or GaAsSb in the case of GaSb light absorbing layer, doped with the same conductivity type impurity as that of the light absorbing layer in a concentration similar to or slightly higher than that of the light absorbing layer, and (d) one second window layer of the same semiconductor type as the first active layer, doped with the same conductivity type impurity as the first window layer but in a relatively high concentration, (e) the second window layer having either a thin layer highly doped with a conductivity type different from the second window layer and positioned within a limited area, or a light sensitive region preferably positioned in the central area of the top surface of the second window layer, (f) the thin highly doped area or the light window being surrounded by a deep closed loop or a guard ring highly doped with the same conductivity as the thin doped layer, (g) the deep highly doped closed loop or the guard ring extending into the first window layer, leaving a space, between the guard ring bottom and the heterojunction of the first window layer and the light absorbing layer, large enough to prevent tunnel current from occurring in this region, for example 0.8 micrometers, (h) the second window layer being separated from the region surrounding the deep highly doped closed loop or the guard ring, and (i) the light window having a second electrode on one portion thereof preferably on the area surrounding the window.

When a reverse bias is applied to an APD having the above mentioned configuration, a depletion layer extends downward more deeply beneath the guard ring than beneath the light sensitive region, resultantly making the breakdown voltage is lower in the light sensitive region than in the region under the guard ring. As a result, avalanche multiplication occurs uniformly in the entire region of the light sensitive region. Further, as described above, the tunnel current effectively prevented, even in the region under the guard ring. As an example, and without limiting the present invention thereto, a compound semiconductor APD, as described above, sensitive to wavelengths in the range of 1.2 micrometers through 1.65 micrometers, and have higher avalanche-gains, sensitivity and response and lower dark-current an noise.

In order to produce the APD presented above, two independent impurity diffusion steps are required, as described in items (e), (f) and (g) above. Further, the diffusion for production of the deep highly doped closed loop or the guard ring requires a long diffusion time at a high temperature thus producing crystal defects in the active or sensitive layer.

In order to overcome these defects, the second method for production of the APD presented above comprises steps in which (a) a light absorbing layer, one first window layer and one second window layer are grown on a substrate or preferably on a buffer grown on the substrate, each having the same conductivity type, (b) the second window layer is selectively removed, leaving a portion thereof corresponding to a light sensitive region which forms a mesa of the second window layer on the area corresponding to the light sensitive region, (c) the top surface of the mesa and the surrounding region is diffused to uniform depths, with impurities having a different conductivity type to produce a shallow diffused region in the light sensitive region and a deep diffused region in the guard ring surrounding the light sensitive region, (d) forming an anti-reflection coat and an insulator layer on top of the second and first window layers except in the area on which a first electrode is produced, and (e) a second electrode is produced on the bottom surface of the substrate. Accordingly, a method for production of the PAD presented above, comprises a simplified impurities diffusion step. Specifically the method produces a stepped diffusion in one processing step with a reduced diffusion temperature and a reduced diffusion time. This single step eliminates the possibility of producing crystal defects in the active or sensitive layers, in addition to the advantage of a reduced number of processing steps and a shorter processing time.

BRIEF DESCRIPTION OF THE DRAWINGS

Our invention, together with its various features and advantages, can be readily understood from the following more detailed description presented in conjunction with the following drawings, in which.

DETAILED DESCRIPTION OF PREFERRED EMBODIMENTS

The following description describes, for illustrative purposes only, an APD in accordance with an embodiment of this invention provided with an n-doped InP substrate, an n-doped InP buffer, an n-doped light absorbing InGaAsP layer, an n-doped first window InP layer and an n-doped second window InP layer, an upper portion of the second window InP layer being doped with a p-type impurity to form a light sensitive region and a portion of the second and first window InP layers surrounding the light sensitive region being doped with a p-type impurity to form a guard ring, and a portion of the second window InP layer surrounding the guard ring being removed.

Figure 1:
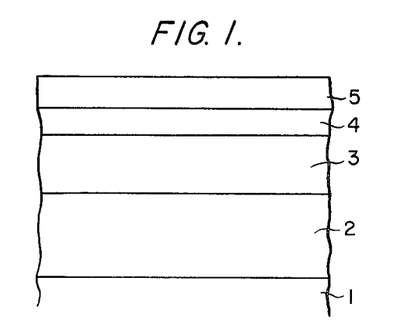
FIG. 1 illustrates the layers of an APD in accordance with a first embodiment of this invention after the completion of the fourth processing step.

Referring to FIG. 1, first a liquid phase epitaxial process is employed to grow a desirable, but not essential buffer InP layer 2 having a thickness of about 10 micrometers on an InP substrate 1 doped to the $10^{16}/cm^3$-concentration. The purpose of this step is of course to improve the crystal quality. The second processing step employs the liquid phase epitaxial process to grow a lattice-matched light absorbing InGaAsP layer 3 having a thickness of 2 micrometers doped to a relatively low concentration for example $10^{16}/cm_3$ on the InP substrate 1 or preferably on the InP buffer layer 2. The light absorbing layer 3 is selected to be thick enough to allow absorption of light and to allow the downward extension of a depletion region beneath the guard ring inherent to this invention. Therefore, a thickness of 2 micrometers is generally preferred, albeit some limitation is imposed by the specific epitaxial process employed. The third processing step employs the liquid phase epitaxial process to grow a lattice-matched first window InP layer 4 having a thickness of 1 micrometer, and doped to a concentration similar to or slightly higher than that of the light absorbing InGaAsP layer 3 or to the $2 \times 10^{16}/cm^3$-concentration. The first window InP layer 4 is selected to be thick enough to allow formation of a p-n junction therein, with space remaining between the p-n junction and the heterojunction between the first window InP layer 4 and the light absorbing InGaAsP layer 3. The space is large enough to prevent tunnel current from occurring therein or equal to a distance of approximately 0.5 micrometers. Therefore, as described above, the thickness of the first window InP layer 4 is selected to be approximately 1 micrometer, albeit some limitation is imposed by the specific epitaxial process employed. The fourth processing step employs the liquid phase epitaxial process to grow a lattice-matched second window InP layer 5 having the thickness of 1 micrometer, and doped to a high concentration, for example, to the $4 \times 10^{16}/cm^3$ The higher doping of this second window InP layer is preferable because it reduces the breakdown voltage in the light sensitive region. The second window InP layer 5 is selected to be thick enough to allow a p-n junction to be formed therein.

Figure 2:
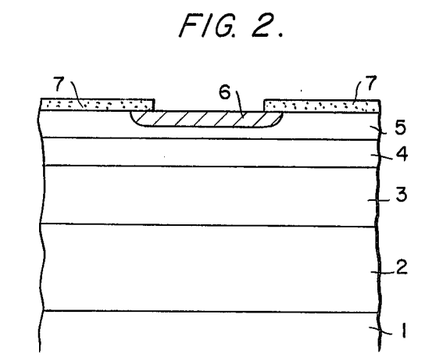
FIG. 2 illustrates the layers of an APD in accordance with a first embodiment of this invention after the fifth processing step and the position of a p-n junction for the avalanche multiplication.

Referring to FIG. 2, a highly p-doped region 6 is produced on the top surface of the second window InP layer 5. This fifth processing step results from either Cd diffusion form a $Cd_3P_2$ source or from Cd ion implantation employing a $SiO_2$ mask 7. A higher doping concentration and a smaller thickness are preferable for region 6, however in view of these conflicting requirements, a 0 5-micrometer thickness doped to $10^{18}/cm^3$ is realistic.

Figure 3:
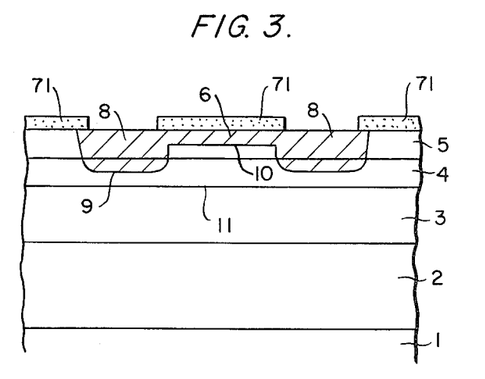
FIG. 3 illustrates the layers of an APD in accordance with a first embodiment of this invention after the sixth processing step and the position of a guard ring.

Referring to FIG. 3, a highly p-doped deep closed loop or a guard ring 8 is produced to surround the highly p-doped region 6. This sixth processing step can be conducted in a manner similar to the fifth step, but employing the SiO2 mask 71. This guard ring 8 must reach the first active InP layer 4. The p-n junction 9 between the guard ring 8 and the first window InP layer 4 is required to be apart from the p-n junction 10 between the highly p-doped region 6 and the second window InP layer 5. Further, the p-n junction 9 is required to be apart from the heterojunction 11, between the first window InP layer 4 and the light absorbing InGaAsP layer 3, to prevent tunneling current from occurring in this region. Therefore, 1 micrometer and 0.5 micrometers are respectively realistic for the distances between the heterojunction 11 and the p-n junctions 10 and 9.

Figure 4:
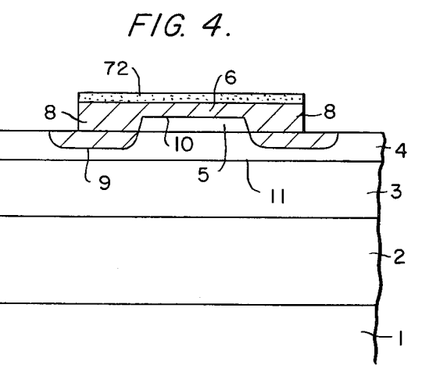
FIG. 4 illustrates the layers of an APD in accordance with a first embodiment of this invention after the seventh processing step and after a portion of a second InP window layer surrounding a light sensitive region is removed.

Referring to FIG. 4, the seventh processing step is to etch a region of the second window InP layer 5 surrounding the guard ring 8, defined by the $SiO_2$ mask 72. As a result, a portion of the second window InP layer 5 remains, forming a mesa.

Figure 5:
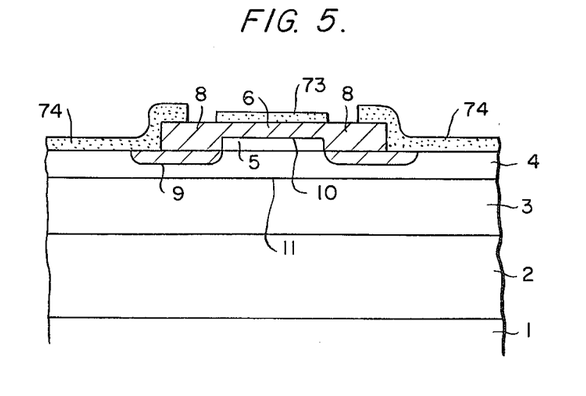
FIG. 5 illustrates the layers of an APD in accordance with a first embodiment of this invention after the completion of the eighth processing step and after the light window is covered by an anti-reflection coat and the top surface of the second and a first InP window layers excluding the area on which an electrode is to be produced, is covered by a passivation film.

Referring to FIG. 5, the eighth processing step is to remove the $SiO_2$ mask 72, before producing a $SiO_2$ anti-reflection coat 73 on the highly p-doped region 6 to make a light sensitive region. The thickness of this anti-reflection coat 73 is, preferably, as thin as possible. Therefore, a 2,000 Å-thickness is realistic. The top surfaces of the second window InP layer and the first window InP layer 4 are then selectively covered by a thick insulator film 74 of $SiO_2$, or PSG and the like for the purpose of passivation.

Figure 6:
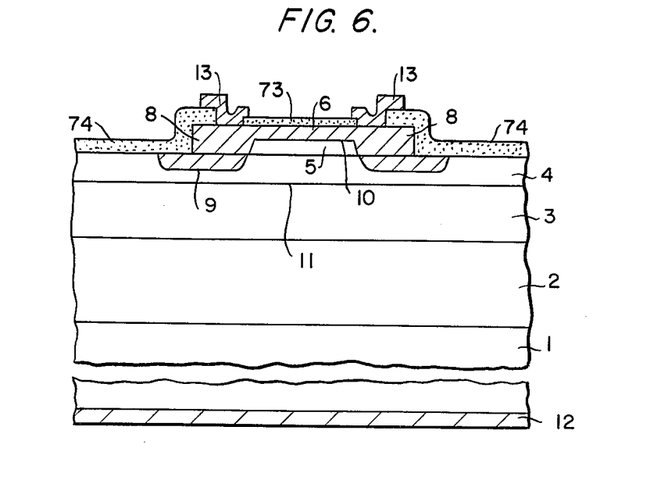
FIG. 6 illustrates the layers of an APD in accordance with an embodiment of this invention after the completion of the ninth processing step, the finished device.

Referring to FIG. 6, the ninth processing step is to produce an electrode 12 of, for example, AuGe beneath the exposed surface of the InP substrate 1 and an electrode preferably a ring shaped electrode 13 of, for example, AuZn on the remaining portion of the top surface of the second window InP layer 5. Employment of evaporation is realistic for implementation of this process.

Figure 7:
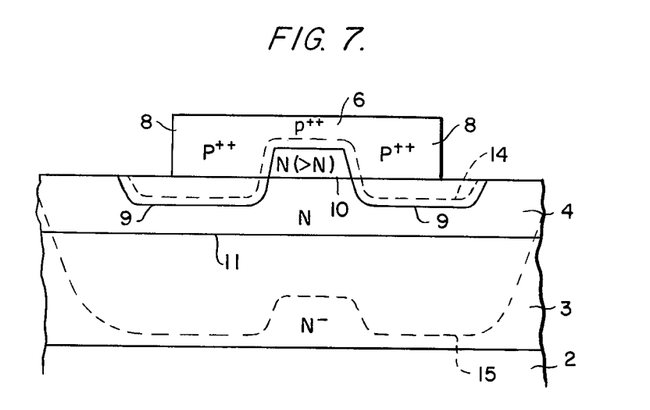
FIG. 7 illustrates the extension of the depletion region due to a reverse bias being applied to an APD having the configuration shown in FIG. 6.

To operate an APD having the above described configuration a positive potential is applied to the electrode 12 and a negative potential is applied to the electrode 13. These potentials function as a reverse bias to the p-n junction 10 for avalanche multiplication and to the p-n junction 9 for a guard ring effect, and form depletion regions which extend on both sides of these p-n junctions. Since the extension of a depletion region depends on the doping concentration of or the amount of majority carriers in the region, the extension of the depletion regions across the p-n junctions 10 and 9 are as qualitatively shown in FIG. 7. In other words, the concentration of the p-doped region of both p-n junctions 10 and 9 is extremely high, for example, at least $10^{18}/cm^3$, thus the extension of the p-side depletion region is extremely small shown as a curve 14. On the other hand, the concentration of the n-doped region facing the light sensitive region or avalanche p-n junction 10, is $4\times10^{16}/cm^3$ in the second window InP layer 5, $1-2\times10^{16}/cm^3$ in the first window InP layer 4, and $10^{16}/cm^3$ in the light absorbing InGaAsP layer 3. Further, the concentration of the n-doped region facing the guard ring 8 is $1-2\times10^{16}/cm^3$ in the first window InP layer 4 and $10^{16}/cm^3$ in the light absorbing InGaAsP layer. Therefore, the contour of the depletion edge becomes non-uniform shown as a curve 15. As a result, the extension of the depletion region is larger in the region facing the guard ring p-n junction 9, than in the region facing the avalanche p-n junction 10. Because the reverse bias is applied across the depletion region, the intensity of the electric field is larger in the region facing the light sensitive region than in the region facing the guard ring 8, resultantly a breakdown occurs in the region facing the avalanche p-n junction 10 or the light sensitive region.

Figure 8:
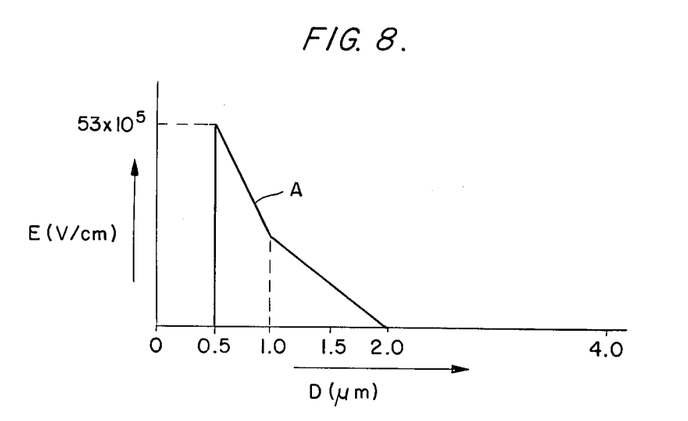
FIG. 8 is a graph of the intensity of electric field as a function of the downward distance from the top surface of the second InP window layer within the light sensitive region.
Figure 9:
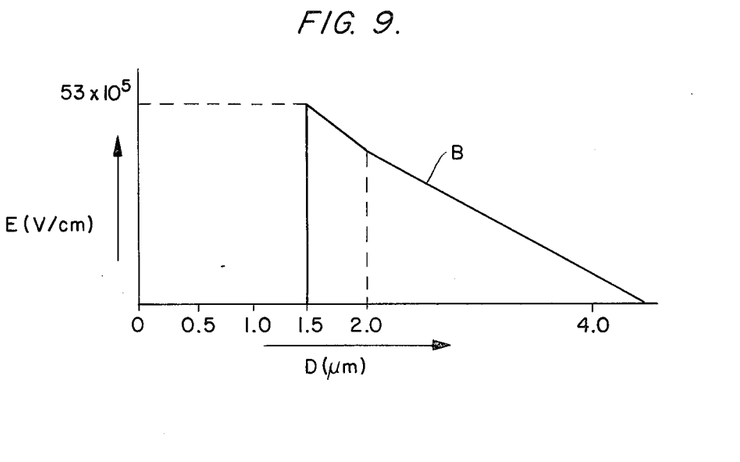
FIG. 9 is a graph of the intensity of the electric field as a function of the downward distance from the top surface of the second InP window layer facing the guard ring.

FIGS. 8 and 9 more clearly illustrate the extension of the depletion region. For convenience of description, the thickness of the second window InP layer 5, the first window InP layer 4 and the light absorbing InGaAsP layer 3 are assumed to be, respectively, 1 micrometer, 1 micrometer and 2 micrometers. Further, the avalanche p-n junction 10 and the guard ring p-n junction 9 are assumed to be located from the top surface of the second window InP layer 5 by 0.5 micrometers and 1.5 micrometers, respectively. Solid lines A and B show the relationship between the intensity of the electric field as a function of the distance from the top surface of the second window InP layer, respectively in the light sensitive region or the avalanche p-n junction 10, and in the region facing the guard ring p-n junction 9 at breakdown. Since breakdown occurs whenever the intensity of the electric field at a p-n junction exceeds a specific intensity, the maximum field intensity is the same both for FIGS. 8 and 9. Since the intensity of a p-n junction electric field is maximum at the p-n junction, the locations at which the intensity of the electric field is maximum are located at points apart from the top surface of the second window InP layer 5 respectively by 0.5 micrometers and by 1.5 micrometers. The slope of the solid lines A and B is determined by the doping concentration of each specific layer, as indicated in the figures. The area surrounded by the solid line A or B and by the X-axis, indicates the junction breakdown voltage. As a result, breakdown voltage is 72 V for the region facing the guard ring p-n junction 9 and the breakdown voltage is 39 V for the region facing the avalanche p-n junction 10. These voltages satisfy the first requirement of this invention, which is to confine breakdown exclusively in the light sensitive region or the avalanche p-n junction 10.

On the other hand, when breakdown occurs in the light sensitive region or the avalanche p-n junction 10, the intensity of the electric field across the guard ring p-n junction 9 is less than that across the avalanche p-n junction 10 by several tens of percent (10%), and the tunnel current remains less than 10-9A, based on the assumption that the diameter of the avalanche p-n junction 10 is 100 micrometers. This current is negligible in comparison with the dark-current generated by other causes. Therefore, the second requirement of this invention, to reduce the effects of tunnel current, is achieved.

The breakdown voltage is less in the region surrounding the guard ring p-n junction 9. Therefore, this region is removed to prevent the avalanche phenomenon from occurring in this region.

As described above in detail, this invention provides an APD sensitive to wavelengths in the range of 1.2 micrometers through 1.65 micrometers, and a new configuration of guard ring which readily realizes the efficient guard ring effect without being accompanied by the tunnel current problem, resultantly realizing higher avalanche-gains, sensitivity and response and with lower values of dark-current and noise.

As described above, a difference is essential in the locations of the avalanche p-n junction 10 and the guard ring p-n junction 9. Therefore, two independent impurity diffusion steps are generally required for production of the APD in accordance with this invention. Further, to produce the deep, highly doped closed loop or the guard ring 8, a long diffusion period at a high temperature is generally required. This causes thermal strain between the SiO2 mask 71 and the second acti InP layer 5, resulting in crystal defects in the 1,000-Å thick top region of the second active InP layer 5. Since the avalanche p-n junction 10 is often produced, in the region containing these crystal defects in a later step, the APD's produced employing the above presented method are inclined to have unsatisfactory avalanche-gains due to the non-uniform breakdown voltage over the entire area of the avalanche p-n junction.

In order to avoid forming these defects, the inventors of this invention present a second improved method for production of the APD structure presented above.

Just for the purpose of giving variety to embodiments presented herewith, the following description discussed a method to produce an APD in accordance with another embodiment of this invention having a layer configuration made of InGaAsP and InP, n-doped to different concentrations than in the above first embodiment, and which requires only one impurity diffusion processing step after a portion of the second window InP layer is etched to form a mesa light sensitive region.

Figure 10:
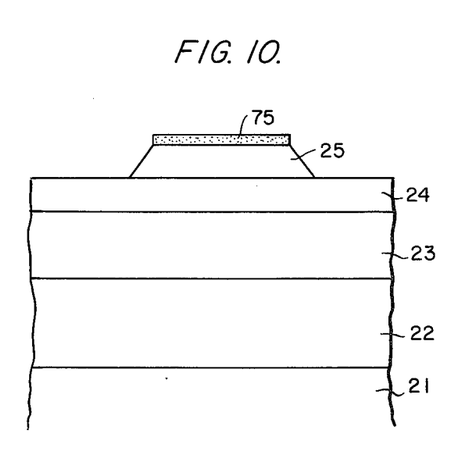
FIG. 10 illustrates the layers of an APD in accordance with a second embodiment of this invention after the completion of the fifth processing step with the second window InP layer etched to form a mesa shape.

Liquid phase epitaxial process is employed to grow a buffer InP layer 22, FIG. 10, having a thickness of several micrometers on an InP substrate 21, before growing a lattice matched light absorbing InGaAsP layer 23 having a thickness of 2 micrometers and doped to a relatively low concentration, for example, $5\times10^{15}$ $1\times10^{16}/cm^3$ thereon. The third processing step employs liquid phase epitaxial process to grow a lattice matched first window InP layer 24 having a thickness of 1.2 micrometers and doped to a concentration of, for example, $1\times10^{16}$–$5\times10^{16}$/cm$^3$, and to grow a lattice matched second window InP layer 25 having the thickness of 1.5 micrometers doped to a high concentration, for example, $1\times10^{16}$ $5\times10^{16}$/cm$^3$.

Referring to FIG. 10, a SiO2 film 75 having the thickness of 3,000 Å is produced on top of the second window InP layer 25, before photolithograph is employed to make a mask covering an area on which a light sensitive region is to be produced. The fifth processing step is to allow a 50° C.-liquid containing equal quantities of H$_2$SO$_4$, H$_2$O$_2$ and H$_2$O to contact the wafer for 15 minutes. Since the etching rate of the liquid for n-doped InP is 0.1 micrometers/min, the second window InP layer 25 is entirely removed, leaving a mesa covered by the mask 75.

Figures 11, 13:
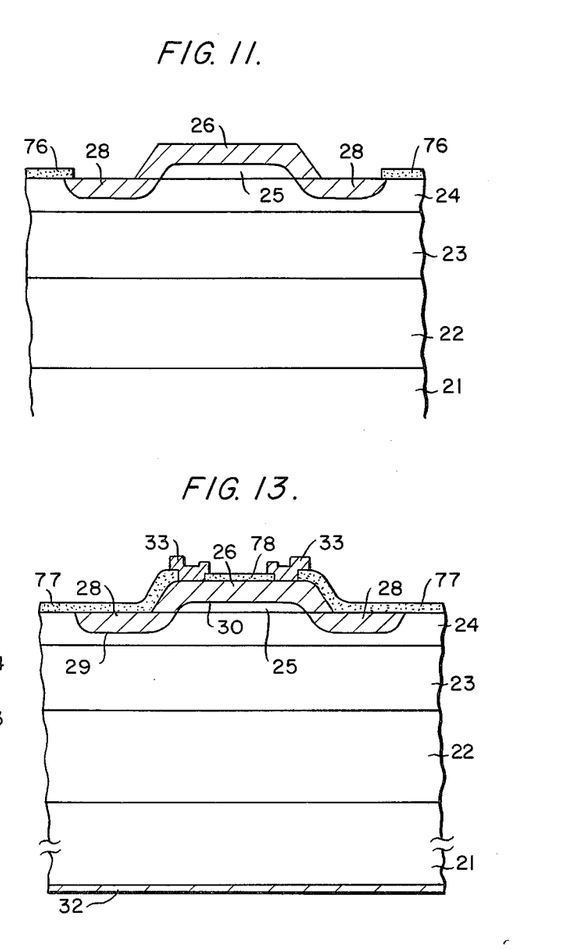
FIG. 11 illustrates the layers of an APD in accordance with providing avalanche multiplication and the guard ring effect.
FIG. 13 illustrates the layers of an APD in accordance with the second embodiment of this invention after the completion of the eighth processing step, the finished device.

Referring to FIG. 11, after the mask 75 is removed, a different SiO2 mask 76 is formed on the top surface of the first window InP layer 24 except on the area in which an avalanche p-n junction and a guard ring p-n junction are to be produced. The next processing step is Cd diffusion employing a CdP$_2$ source at a temperature of 500° C. for 30 minutes to produce a 0.8-micrometer thick Cd-doped layer having a concentration of approximately 10$^{18}$/cm$^3$. The Cd-doped layer 26 in the second window InP layer 25 forms an avalanche p-n junction and the Cd-doped layer 28 in the first window InP layer 24 forms a guard ring p-n junction, 29.

Figure 12:
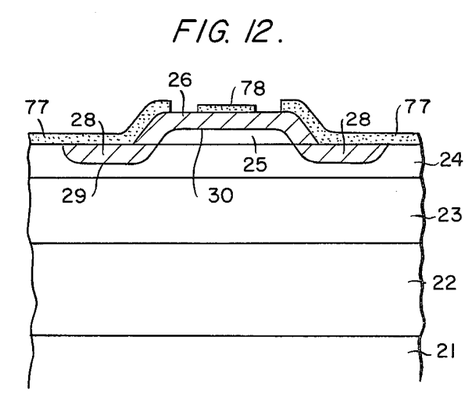
FIG. 12 illustrates the layers of an APD in accordance with the second embodiment of this invention after the completion of the seventh processing step and after the light sensitive region is covered by the antireflection coat and the top surface of the second and first window InP layers excluding the area on which an electrode is to be produced, is covered by a passivation film.

Referring to FIG. 12, the seventh processing step is to produce a SiO$_2$ anti-reflection coat 78 on the Cd doped layer 26 to make a light window, and selectively forming a thick insulation film 77 of SiO$_2$, PSG and the like on the top surfaces of the second window InP layer 25 and the first window InP layer 24 for the purpose of passivation and defining an area on which an electrode is to be produced in the next step.

Referring to FIG. 13, the eighth processing step is to produce an electrode 32 of, for example, AuGe on the exposed surface of the InP substrate 21, and the selective formation of an electrode, preferably a ring shaped electrode 33 of, for example, AuZn on the remaining portion of the top surface of the second window InP layer 25.

Since the n-doping concentration is $1\times10^{16}$/cm$^3$ for the light absorbing InGaAsP layer 23 and for the first window InP layer 24 and the n-doping concentration is $3\times10^{16}$/cm$^3$ for the second window InP layer 25, the breakdown voltage of the region facing the avalanche p-n junction 30 or the light sensitive region is observed to be 51 V and the breakdown voltage of the region facing the guard ring p-n junction 29 is observed to be 80 V. These voltages satisfy the first requirement of this invention which is to confine breakdown exclusively in the light sensitive region or the avalanche p-n junction 30. As described above in detail, provided in accordance with this second embodiment is a method for production of the APD presented above, comprising simplified impurity diffusion steps. Specifically, the method enables stepped diffusion layer formation in one processing step with a reduced diffusion temperature and a reduced diffusion time, resultantly removing the possibility of producing crystal defects in the active or sensitive layers, in addition to the advantage of reduced processing time.

Albeit the invention has been described with reference to specific embodiments, this description is not meant to be construed in a limiting sense. Various modifications of the disclosed embodiments, as well as other embodiments of this invention, will become apparent to persons skilled in the art upon reference to the description of this invention. It is therefore contemplated that the appended claims will cover any such modifications or embodiments as within the true scope of this invention.

What is claimed is:

1. An avalanche photodiode comprising:
   a light absorbing semiconductor layer comprising a first semiconductor material having a first band gap and doped with a first conductivity type impurity to a first concentration;
   a first window semiconductor layer formed on said light absorbing semiconductor layer, comprising a semiconductor material having a larger band gap than said first band gap, and doped with the first conductivity type impruity to a second concentration at least as high as said first concentration;
   a second window semiconductor layer having an outer perimeter, formed on a predetermined portion of said first window semiconductor layer, comprising the same semiconductor material as that of said first window layer, doped with the first conductivity type impruity to a concentration higher than said second concentration;
   a first region of said second window semiconductor layer being of highly doped with a second conductivity type impurity to a third concentration higher than said second concentration, said first region providing a p-n junction for avalanche multiplication and a light sensitive region;
   a second region of said second window semiconductor layer adjacent to said first region, and a top region of said first window layer surrounding said outer perimeter of said second widow semiconductor layer, both said second region and said top region being highly doped with the second conductivity type impurity to a concentration higher than said second concentration, said second region being doped to a first depth above the junction between said light absorbing layer and said first window layer and said top region being doped to a second depth above the junction between said light absorbing layer and said first window layer, said second region and said top region forming a p-n junction guard ring effect.

2. An avalanche photodiode according to claim 1, wherein said first semiconductor material is selected from the group of InGaAs and InGaAsP.

3. An avalanche photodiode according claim 1, wherein said first window semiconductor layer and said second window semiconductor layer comprise InP.

4. An avalanche photodiode according to claim 1, wherein said first concentration is approximately one times $1\times10^{16}$/cm$^3$.

5. An avalanche photodiode according to claim 2, wherein said second concentration is selected to be within the range of $1\times10^{16}$–$2\times10^{16}$/cm$^3$.

6. An avalanche photodiode according to claim 5, wherein said concentration higher than said second concentration is selected to be approximately $4\times10^{16}$/cm$^3$.

7. An avalanche photodiode according to claim 1, wherein said first window semiconductor layer has a thickness selected to be approximately 1 micrometer.

8. An avalanche photodiode according to claim 4, wherein said first window semiconductor layer has a thickness selected to be approximately 1 micrometer.

9. An avalanche photodiode according to claim 5, wherein said first window semiconductor layer has a thickness selected to be approximately 1 micrometer.

10. An avalanche photodiode according to claim 6, wherein said first window semiconductor layer has a thickness selected to be approximately 1 micrometer.

11. An avalanche photodiode according to claim 1, wherein said second window semiconductor layer has a thickness selected to allow a p-n junction to be formed therein.

12. An avalanche photodiode according to claim 4, wherein said second window semiconductor layer has a thickness selected to allow a p-n junction to be formed therein.

13. An avalanche photodiode according to claim 5, wherein said second window semiconductor layer has a thickness selected to allow a p-n junction to be formed therein.

14. An avalanche photodiode according to claim 6, wherein said second window semiconductor layer has a thickness selected to allow a p-n junction to be formed therein.

15. An avalanche photodiode according to claim 10, wherein said second window semiconductor layer has a thickness selected to allow a p-n junction to be formed.

* * * * *

UNITED STATES PATENT AND TRADEMARK OFFICE
CERTIFICATE OF CORRECTION

PATENT NO. : 4,442,444
DATED : April 10, 1984
INVENTOR(S) : OSAKA

It is certified that error appears in the above-identified patent and that said Letters Patent is hereby corrected as shown below:

```
Front page, [57] ABSTRACT, line 23, "an" should be --and--.
Column 1, line 1, after "AVALANCHE PHOTODIODES" insert
          --AND METHOD FOR PRODUCING SAME--;
          line 38, "therey" should be --thereby--.
Column 2, line 11, delete "the" (first occurrence);
          line 32, "wellknown" should be --well-known--;
          line 44, after "reports" insert --, in Applied
          Physics Letters 35(3) 1 August 1979 pages 251
          through 253,--.
Column 4, line 5, "an" should be --and--;
          line 34, "PAD" should be --APD--.
Column 8, line 39, "acti" should be --active--;
          line 52, "discussed " should be --discusses--.
Column 9, line 5, "5" should be -- -5--;
          line 9, "anarea" should be --an area--.
```

Signed and Sealed this

Fourteenth Day of May 1985

[SEAL]

Attest:

DONALD J. QUIGG

*Attesting Officer*  *Acting Commissioner of Patents and Trademarks*